United States Patent
Kluge

(10) Patent No.: US 8,630,092 B2
(45) Date of Patent: Jan. 14, 2014

(54) COOLING BOX FOR COMPONENTS OR CIRCUITS

(75) Inventor: Claus Peter Kluge, Röslau (DE)

(73) Assignee: CeramTec GmbH, Plochingen (DE)

( * ) Notice: Subject to any disclaimer, the term of this patent is extended or adjusted under 35 U.S.C. 154(b) by 658 days.

(21) Appl. No.: 12/596,849

(22) PCT Filed: Apr. 17, 2008

(86) PCT No.: PCT/EP2008/054641
§ 371 (c)(1),
(2), (4) Date: Oct. 23, 2009

(87) PCT Pub. No.: WO2008/132056
PCT Pub. Date: Nov. 6, 2008

(65) Prior Publication Data
US 2010/0163210 A1 Jul. 1, 2010

(30) Foreign Application Priority Data
Apr. 26, 2007 (DE) .......................... 10 2007 020 170

(51) Int. Cl.
*H05K 7/20* (2006.01)

(52) U.S. Cl.
USPC ...... 361/713; 361/679.46; 361/688; 361/712; 361/760; 174/252; 174/526; 174/547

(58) Field of Classification Search
USPC .................. 361/676, 679.46, 679.54, 688, 361/701–722, 760–767
See application file for complete search history.

(56) References Cited

U.S. PATENT DOCUMENTS

| | | | | |
|---|---|---|---|---|
| 5,001,299 A | * | 3/1991 | Hingorany | 174/521 |
| 6,432,253 B1 | * | 8/2002 | Chung | 156/295 |
| 7,092,255 B2 | * | 8/2006 | Barson et al. | 361/699 |
| 7,551,439 B2 | * | 6/2009 | Peugh et al. | 361/699 |
| 7,817,428 B2 | * | 10/2010 | Greer et al. | 361/720 |
| 7,864,532 B1 | * | 1/2011 | Ehret et al. | 361/713 |
| 7,911,794 B2 | * | 3/2011 | Hasegawa | 361/700 |
| 7,916,484 B2 | * | 3/2011 | Chyn et al. | 361/710 |
| 7,974,099 B2 | * | 7/2011 | Grajcar | 361/720 |
| 8,081,467 B2 | * | 12/2011 | Taylor | 361/710 |
| 8,130,499 B2 | * | 3/2012 | Ohnishi et al. | 361/710 |
| 2006/0005945 A1 | | 1/2006 | Wei et al. | |
| 2007/0227708 A1 | * | 10/2007 | Hom et al. | 165/121 |

FOREIGN PATENT DOCUMENTS

| | | |
|---|---|---|
| DE | 9110268 | 11/1991 |
| DE | 92 01 158 U1 | 3/1992 |
| DE | 29514012 | 11/1995 |
| DE | 29612943 | 10/1996 |
| DE | 19527674 | 2/1997 |
| DE | 196 43 717 A1 | 4/1998 |
| DE | 103 34 354 A1 | 7/2004 |
| EP | 1 225 633 A | 7/2002 |
| EP | 1 585 173 A | 10/2005 |

* cited by examiner

*Primary Examiner* — Courtney Smith
(74) *Attorney, Agent, or Firm* — James R. Crawford; Fulbright & Jaworski LLP

(57) ABSTRACT

A cooling box for electric or electronic components, consisting of a material, wherein the cooling box is non-electrically conductive or practically non-electrically conductive, is configured in one piece or multiple pieces and has a cavity that is enclosed by the material, wherein cavity being closed or provided with at least one opening.

2 Claims, 4 Drawing Sheets

COOLING BOX FOR COMPONENTS OR CIRCUITS

Figure 1:
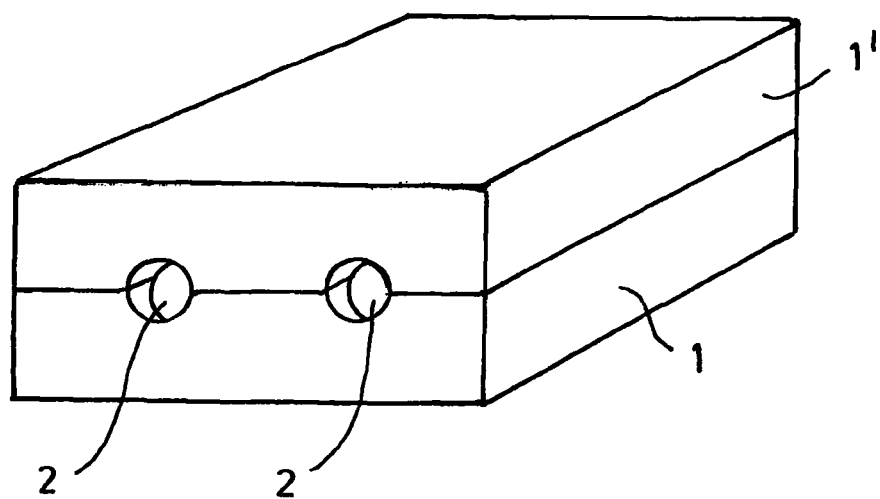

This application is a §371 of PCT/EP2008/054641 filed Apr. 17, 2008, and claims priority from DE 10 2007 020 170.4 filed Apr. 26, 2007.

The invention relates to a cooling box for electrical or electronic component elements or circuits made of a material, the cooling box being electrically non-conductive or virtually non-conductive, being constructed in one piece or more than one piece and having a hollow space enveloped by the material, and this hollow space being closed or provided with at least one opening.

According to the prior art, for the dissipation of heat from modules of power electronics, planar structures are constructed which dissipate the heat diffusing from a heat source (active or passive electrical component) into an electrically non-conductive, uniformly shaped, simple geometrical body (disc, rectangular substrate) via numerous intermediate layers (solders, conductive pastes, adhesives, metallisations). Although the geometry of the individual components is simple, the layered construction as a whole is complicated and requires consecutive application of a wide variety of processes which are susceptible to faults, such as adhesive bonding, pressing, screwing and, to a limited extent, also soldering. Each interface of this stack construction represents a barrier for heat transfer and reduces either the reliability and/or service life of the module (oxidation, burning through, ageing) or limits its power.

Cooling boxes are described in DE 296 12 943 U1, DE 91 10 268 U1, DE 92 01 158 U1, DE 195 27 674 C2 or DE 295 14 012 U1.

Organic and ceramic circuit carriers with low or inadequate thermal conductivity have to be permanently attached to a metallic cooling body in an interlocking manner by additional measures, such as electrically insulating intermediate layers. With increasing thermal loads, some of the heat sources have to be removed from the printed circuit board and mounted, in the conventional manner, on a metallic cooling body and electrically connected to the circuit carrier.

The construction comprising a plurality of different materials is complex and a compromise in terms of long-term reliability. An increase in power density is possible only to a small extent.

The thermal conductivity can be used only under certain circumstances, since a plane-parallel construction is involved.

A direct connection of an electrically conductive body and a heat source is likewise not possible.

In the case of power thyristors, an alternating construction of cooling body and thyristor is usually chosen. In order for the heat transfer to be optimal, this construction is mechanically braced. This bracing is accompanied by a dynamic process of thermal expansion. The control of the bracing forces over time can only be ensured by additional outlay.

The object on which the invention is based is to substantially improve a cooling box according to the precharacterising clause of Claim 1 with regard to the thermal dissipation. Furthermore, the form of application of a cooling box is to be extended. In a further object, the reliability of the cooling box and its resistance to thermal cycling is to be improved.

According to the invention, this object is achieved by the features of Claim 1.

According to the invention, at least one surface region of the cooling box is defined by the functions of electrical and/or thermal conductivity. In a preferred development, the surface region of the cooling box which is defined by the functions of electrical and/or thermal conductivity is a metallisation layer sintered to the material of the cooling box.

As a result of this sintered-in metallisation layer, the heat dissipation of the components connected (soldered) to the metallisation layer is substantially improved.

In the case of small-area power semiconductors, as components with extreme waste heat, the connection of the cooling box and semiconductor with matched coefficients of expansion can afford a significantly higher level of reliability.

In one configuration according to the invention, the surface region is a printed circuit board. By surface region is meant that part of the cooling box which is defined by the functions of electrical and/or thermal conductivity, i.e. that part which has the metallisation layer sintered to the material of the cooling box. The cooling box thus at the same time has the function of a printed circuit board with an extremely high thermal conductivity.

The conductor tracks are applied to the cooling box by the metallisation layer, i.e. the sintered metallisation layers can be applied such that they form a printed circuit board. The conductor tracks of the printed circuit board are thus intimately connected to the cooling box via a thermal process (sintering). In addition, metallic conductor tracks can also be adhesively bonded on and conductive adhesive can be used. Combinations of different types of conductor tracks may also be employed.

According to the invention, the components have a direct outflow of heat into the cooling box. The components can be connected to the cooling box, for example, directly or via one or more layers.

The terms component elements and components describe the same objects hereinbelow.

In one embodiment, the hollow space of the cooling box has a heating or cooling medium admitted to it. The heating or cooling medium can remain permanently in the hollow space or be exchanged continually or as required, via at least one entrance to the hollow space, for an identical or different heating or cooling medium with an identical or different temperature.

The heating or cooling medium is preferably a gas, such as, for example, air or nitrogen or a liquid, such as, for example, water or oil.

In a preferred configuration, the cooling box consists of at least one ceramic component or a composite of different ceramics. The ceramic components can be present, in the crystallographic sense, in monocrystalline or polycrystalline form or combinations thereof.

Preferably, sub-pieces of a cooling box of more than one piece are connected to one another by adhesive bonding, sintering, soldering, reaction soldering, clamping, riveting, bracing and preferably by sealing with additional sealing material. Combinations of at least two different connecting techniques for the assembly of a cooling box consisting of at least two sub-pieces are also possible.

Examples of possible ceramic components or ceramics are aluminium oxide, technical aluminium oxide, zirconium oxide, differently doped zirconium oxides, aluminium nitride, silicon nitride, silicon oxide, glass ceramic, LTCC ceramics (Low Temperature Co-fired Ceramics), silicon carbide, boron nitride, boron oxide.

Of particular technical importance are technical 96%-pure aluminium oxide with thermal conductivities of approximately 24 W/mK, and technical >99%-pure aluminium oxide with approximately 28 W/mK, technical or pure aluminium nitrides with, for example, approximately 180 W/mK, aluminium oxides strengthened with zirconium oxide with approximately 24 W/mK, and glass ceramics with approximately 2 W/mK.

High thermal conductivities are of particular technical importance in applications such as power electronics, high-power LEDs, slow-response high-load fuses, processors, power resistors. Low thermal conductivities are of particular technical importance in rapid-response high-load resistors and in applications in which it is necessary to ensure over a surface (the cooling box) a temperature distribution which is as uniform as possible. Here, thermoanalytical measurement arrangements may be mentioned, for example.

In a special configuration, the cooling box consists of a composite material and the composite material contains electrically non-conductive or virtually non-conductive matrix materials with thermally conductive additives.

The matrix materials used are preferably resins, polymers or silicones.

In a preferred configuration, the composite materials are multicomponent systems consisting of polymers or silicones mixed with ceramic components, such as, for example:

a) polymers with $Al_2O_3$
b) polymers with AlN
c) silicones with $Al_2O_3$/AlN
d) silicones and polymers with $ZrO_2$/$Y_2O_3$ The cooling box may also be a composite of metal and/or ceramic or a composite of ceramic and metal.

The cooling box may also be fabricated as a hybrid by, in the case of cooling boxes of more than one piece, making at least one piece from metal. Use may be made, for example, of aluminium, copper, nickel, tungsten or special steels.

In one embodiment, the metallisation layer on the cooling box is of multilayered construction.

Expediently, the electrical or electronic component elements are electrically conductively and/or thermally conductively connected to the cooling box. Component elements can be, for example, electrical or electronic or active or passive or geometrical bodies or any desired combinations thereof.

In a development of the invention, at least one mounting facility is connected to the cooling box.

The cooling box can be connected to further cooling boxes with or without electrical or electronic component elements or circuits, via the mounting facility. The fastening can be effected via screwing, riveting, clamping, adhesive bonding, crimping, welding, soldering or further fastening possibilities.

The surface of the hollow space of the cooling box can assume the functions of all the surfaces which do not belong to the hollow space of the cooling box, and vice versa.

In a development of the invention, the surface of the cooling box and/or the surface of the cooling box belonging to the hollow space bears or has any desired surface structurings which bring about the effect of altering the surface.

Advantageously, one or more surface structurings or combinations thereof are arranged on the cooling box and the surface structurings are, for example, roughenings, furrows, corrugations, apertures in the surface or dendritic or branching structures.

Preferably, the surface structurings are planar or uneven or rough surfaces which are connected, in particular in an interlocking manner and/or permanently and/or temporarily or as a combination thereof, to likewise uneven or planar or rough surfaces of components to be mounted. The type of connection can be, for example, soldering or adhesive bonding.

In a special embodiment, the cooling box has an interlocking connection to component elements over the entire surface or over part of the surface. The connection can be present, for example, permanently or temporarily or as a combination thereof. Component elements can be, for example, electrical or electronic or active or passive or geometrical bodies or any desired combinations thereof.

In one configuration, the cooling box is flat or provided with cutouts or with elevations, these being formed in one piece or more than one piece with the respective cooling-box element.

Furthermore, the metallisation layers are greater than 5 μm and are applied using DCB processes (Direct Copper Bonding) or AMB processes (Active Metal Brazing). The metallisation layers can consist, for example, of copper or aluminium or combinations thereof.

The construction according to the invention with components is present, for example, in the rest state at room temperature. During operation, local temperature maxima may now arise in a very short period of time at the components as a result of their operation. So-called thermal shock results in the environment of the component. The construction according to the invention can withstand this state without any intrinsic damage. If these states occur alternately, so-called thermal cycling, then in the case of conventional constructions with, for example, adhesively bonded conductor tracks, after relatively few cycles detachment phenomena of conductor tracks on the cooling box result, for example. The construction according to the invention displays a considerably improved resistance to thermal cycling in comparison with conventional constructions.

In a development of the invention, identical or different component elements are fixed on the cooling box with identical or different spatial orientations. The orientation can take place, for example, by means of different amounts of solder or different cutouts or elevations or any desired combinations of orientation possibilities. In the case of LEDs, for example, their orientation and therefore the light can thus be oriented in a simple manner.

Advantageously, the cooling box according to the invention can be used as a mounting body for component elements, in particular electrical or electronic component elements.

In one configuration of the invention, the cooling box is connected to sensory components. Sensory components can emit, for example, signals from which variables such as pressure, temperature, weight, etc. can be derived.

In one configuration of the invention, sensory signals are derived from the partial or total deformation of the cooling box.

According to the invention, the cooling box is partially provided with metallic regions. These regions can connect the upper and lower sides of the cooling box electrically to one another, for example.

Preferably, the cooling box builds up virtually no electrochemical potential with respect to other materials. Given corresponding coupling, for example, the corrosion of the cooling box or of the environment can therefore be significantly reduced.

In one inventive configuration, the cooling box is used as a heat source by the heat produced being released via the cooling box to the medium whose temperature is to be regulated. The medium whose temperature is to be regulated can contact the hollow space surface or the surface not associated with the hollow space.

Preferably, the cooling box has a targeted temperature distribution owing to supplied heat or cold which is transferred to the cooling box. For example, temperature differences in the environment can thus be compensated for in a targeted manner.

Preferably, substances are applied to the cooling box which make bonding processes possible. By way of example, a metallisation construction W—Ni—Au (tungsten-nickel-gold) can be used here in order to make gold-wire bonding possible. The substances may consist of one or more materials, which are applied to the cooling box mixed or from at least one layer. The substances may consist, for example, of materials such as gold or layers comprising a plurality of materials such as copper, nickel and gold or comprising mixtures of at least two different materials, such as metals and/or additives, for example, and layers of identical or different metals or additives.

In a development of the invention, one or more light-emitting substances or one or more light-emitting components or combinations thereof are connected to the cooling box. For example, this may be a semiconductor or a housing with a semiconductor, such as is used for LED lighting systems.

Preferably, metals or metal layers are connected over the entire surface or over part of the surface to the cooling box intimately or by a mechanical interlocking connection and have an identical or different thermal conductivity to the cooling box. Metals or metal layers may be, for example, pure-grade or technical-grade tungsten, silver, gold, copper, platinum, palladium, nickel or mixtures of at least two different metals. Metals or metal layers can also be mixed, for example, with adhesion-promoting agents or other additives such as glasses or polymeric materials. Metals or metal layers may also be, for example, reaction solders, soft solders or hard solders.

It should be stressed in particular that, in the case of punctiform heat sources, the heat needs to be spread, i.e. distributed, very rapidly over the entire surface of the cooling box. The cooling box, with comparatively low thermal conductivity, can thus receive the heat produced, via the metal, distributed over its entire surface. Since the cooling box is electrically insulating, the metal can at the same time fulfil the function of electrical conductivity and thermal conductivity.

In one configuration according to the invention, the metals or the metal layers on the cooling boxes may have different functions. For example, they can have the function of electrical conductivity and/or of thermal conductivity or the function of a colour change of the surface or thermal spreading or an adhesion promoter to third materials, such as, for example, solders, adhesives, and any desired combinations of the functions of identical or different metal regions.

The advantage consists in the matched current-carrying capacity of the metal regions. The metal regions therefore need not necessarily have the same heights or thicknesses, for example.

Consequently, the metals or the metallisation layers are connected to the material of the cooling box over the entire surface or over part of the surface with identical or different thicknesses (heights) in identical or different metal regions.

In another configuration according to the invention, identical or different metals are connected as metallisation layers to the material of the cooling box over the entire surface or over part of the surface, with one or more layers with identical or different thicknesses (heights).

In a further configuration, the cooling box has the intrinsic colouring of the material(s) used over the entire surface or over part of the surface or subregions of the cooling box are coloured differently from the intrinsic colouring.

Based on a technical aluminium oxide, the cooling box can be provided, for example during the production process thereof, with colour-imparting additives, so that the bulk material is completely and mechanically inseparably penetrated by colour as a result of a thermal treatment.

For example, based on a technical zirconium oxide, the cooling box can be provided, after the production process thereof, for example over the surface with colour-imparting additives, so that the surface of the bulk material is completely penetrated by colour as a result of a thermal treatment. Depending on the depth of penetration of the resulting coloration, the bulk material can also retain its intrinsic colouring internally. The gradient of the coloration can assume a very wide variety of characteristics.

For example, based on a technical aluminium nitride, the cooling box can be provided with colour-imparting layers, so that the bulk material of the cooling box is not coloured as a result and the change in colour is only produced by one or more mechanically separable layers. Colour-imparting layers may be, for example, varnishes, glazes, adhesive films, metals etc.

In another configuration, the cooling box is connected to at least one further geometrically identical or different cooling box via suitable connecting materials to form a type of three-dimensional array.

Connecting materials may have a single-layered or multilayered nature. Connecting materials may be identical or different in nature or else be used in combination with a single-layered or multilayered construction. By way of example, connecting materials such as adhesives, metallisations, metals, metals which have been connected to the cooling box, by way of example, by processes such as DCB (Direct Copper Bonding) or AMB (Active Metal Brazing) may be mentioned. It is also possible, for example, to use solders, reaction solders, double-sided adhesive films, etc.

In one embodiment, the cooling box is connected to one or more light-emitting substances or one or more light-emitting components and combinations thereof and, at the same time, is preferably provided with standardised or non-standardised electrical connectors. It is also possible for combinations of identical or different electrical connectors to be used. A mechanical connection to the cooling box which is appropriate for the electrical connector is preferably used. Electrical connectors may be, for example, lamp bases E27, E14, GU series, G series, U series, R series, plug-in bases, bayonet-type bases, clamping connectors, screw connectors, plug-in connectors, etc. Mechanical connections or combinations of mechanical connections may be, for example, adhesive bonding, soldering, crimping, riveting, clamping, etc.

In a further configuration, at least one cooling box is connected to at least one further geometrical body via suitable connecting materials to form a type of three-dimensional construction. Connecting materials may have a single-layered or multilayered nature. Connecting materials may be identical or different or may also be used in combination with a single-layered or multilayered construction. At least one or more identical or different cooling boxes can be attached at any desired points with identical or different orientations. By way of example, connecting materials, such as adhesives, metallisations, metals, metals which, by way of example, have been connected to the cooling box by processes such as DCB (Direct Copper Bonding) or AMB (Active Metal Brazing), solders, reaction solders, double-sided adhesive films, etc: may be mentioned. By way of example, geometrical bodies may be plates on which at least one or more identical or different cooling boxes are located in different regions.

The cooling box may be, for example, part of a plastic housing.

In another configuration, at least one and/or different or identical cooling boxes are embedded in a matrix material with any desired orientation or oriented in the same direction. The embedding can take place, for example, by injection moulding or die-casting. The embedding compositions themselves should be selected as desired and according to the respective intended functions. Plastics are particularly suitable.

According to the invention, in the case of a cooling box, a change in the heat transport is achieved by modifying the size or the colouring or modifying the geometry of the metallised regions or metallisation layers or combinations thereof. If, for example, the design of the hollow space in the cooling box is changed, in the case of a constant input of heat, the absolute temperature in the steady state or in the state of equilibrium can change by thermal energy being emitted or absorbed. This can also take place, for example, by the hollow space in the cooling box being added or removed or increased or decreased in size in a targeted manner. The change can also take place, for example, by a change in the colour. Thus, the emission characteristics of a black body are different from those of a white body.

The surface of the hollow space can also assume the functions of the surface not belonging to the hollow space, i.e. be formed, for example, as a printed circuit board. The metallisation layers are applied to the outer or inner surface of the cooling box by sintering.

High-power semiconductors with or without thermal power loss, such as, for example, MOSFETs, IGBTs, processor cores, are preferably connected directly or indirectly to the cooling box. As a result, the waste heat arising is passed on to the material of the cooling box at the same time and automatically. The material of the cooling box can then pass on the quantity of heat to the heating or cooling medium. The process can also take place in the opposite direction, so that the quantity of heat is removed from the heating or cooling medium. A combination of both transport directions can also be utilised.

In a configuration according to the invention, the metallisation regions consist of tungsten and are chemically nickel-plated or gold-plated. The metallisation regions are circular in one configuration.

In a special configuration, the cooling box is provided with electrical conductor tracks, via which electrical voltages up into the kV range can be transported without electrical voltage flowing away via the material of the cooling box. Of particular technical interest are electrical voltage ranges of from 1 volt to 600 volts, and voltages >>2 kvolts (2000 volts).

In a preferred embodiment, the cooling box does not have any screening effect or has little screening effect with respect to electrical or magnetic or electromagnetic fields or combinations thereof, and therefore these fields can pass through the cooling box.

In one configuration, the cooling box is provided in a targeted manner with materials over the entire surface or over part of the surface, the function of these materials being to provide regions in which a different screening effect with respect to electrical or magnetic or electromagnetic fields or combinations thereof occurs in comparison with the screening effect of the material of the cooling box.

Preferably, by applying suitable materials, such as metals, for example, in a targeted manner to the cooling box, regions are arranged which, owing to their geometry, via inductive or capacitive effects or combinations thereof are capable of receiving or transmitting electrical or magnetic or electromagnetic signals. Signals in the broadest sense are used for the wireless transmission of energy. The energy can also transmit additional information, for example by means of modulation.

In a configuration according to the invention, the cooling box is equipped with the functionality of intelligent self-identification. Self-identification may be, for example, lettering or marking or a magnetic strip with corresponding information or an RFID unit (radio-frequency identification) or combinations thereof.

In one configuration, the cooling box is connected directly or indirectly to at least one laser diode of identical or different wavelength. The laser diode can be a module or the light-emitting semiconductor itself. An indirect connection would be, for example, screwing on, adhesive bonding, clamping. A direct connection would be, for example, soldering on.

In one embodiment, the cooling box is connected directly or indirectly to at least one power module of identical or different design, which, for example, regulates the starting current of an electric motor. An indirect connection would be, for example, screwing on, adhesive bonding, clamping. A direct connection would be, for example, soldering on.

In one embodiment, only one electrical conductor of a power semiconductor is, for example, soldered onto one cooling box and at least one other electrical conductor of the power semiconductor is, for example, soldered onto another cooling box, in order to ensure optimum heat transfer at the same time as electrical insulation. Suitable power semiconductors can thus be, for example, soldered to at least two cooling boxes in order to strengthen the desired cooling effect using a type of sandwich construction.

In one embodiment, the material of the cooling box is chosen so that the cooling box can come into contact with corrosive or conically conductive heating or cooling media.

In one embodiment, the cooling box is equipped with standardised or non-standardised connectors for the heating or cooling medium.

Preferably, the material of the cooling box or the ceramic material contains as the main component 50.1% by weight to 100% by weight of $ZrO_2/HfO_2$ or 50.1% by weight to 100% by weight of $Al_2O_3$ or 50.1% by weight to 100% by weight of AlN or 50.1% by weight to 100% by weight of $Si_3N_4$ or 50.1% by weight to 100% by weight of BeO, 50.1% by weight to 100% by weight of SiC or a combination of at least two of the main components in any desired combination in the given percentage range, and contains as the secondary component the elements Ca, Sr, Si, Mg, B, Y, Sc, Ce, Cu, Zn, Pb in at least one oxidation state and/or compound with a proportion of ≤49.9% by weight individually or in any desired combination in the given percentage range, and the main components and the secondary components are combined with one another in any desired combination with one another to form a total composition of 100% by weight, with deduction of a proportion of impurities of ≤3% by weight.

In one embodiment, in the case of cooling boxes of more than one piece, at least one piece of the cooling box consists of a metallic material. Examples of metallic materials which may be mentioned are aluminium, copper, nickel, as well as the technical variants of highest-grade metals or special steels.

In one embodiment, the metallic piece of a cooling box consists of combinations of different metals.

In one embodiment, surface regions of the cooling box over the entire surface or over part of the surface are provided with conductor tracks capable of carrying high current and standardised or non-standardised conductor connections capable of carrying high current.

In one embodiment, at least a thin layer <1000 μm of identical or different material is applied to the cooling box over the entire surface or over part of the surface by sputtering or lithographic processes or combinations of same.

In one embodiment, an alternating stack construction of cooling box and component to be cooled takes place by partially or completely connecting individual levels or all the levels of the stack. The connection can be, for example, adhesive bonding or clamping or soldering or brazing or phase-change materials.

Preferably, cooling boxes of more than one piece are connected to one another by the processes of DCB (direct copper bonding) or AMB (active metal brazing) or metallisations, such as tungsten. In this case, the metals can cover the sealing surface over the entire surface or over part of the surface and/or be greater than the actual sealing surface.

In one embodiment, metal regions which are greater than the sealing surface also assume other functions, such as that of a seal. Other functions can be, for example, a mounting possibility, electrical signal forwarding, electrical connection, thermal conduction, connection to a further cooling box or combinations thereof.

In one embodiment, the heating- or cooling-medium connections of at least two cooling boxes are connected to one another in series or in parallel.

In one embodiment, a quantity of heat is supplied to at least one cooling box and a quantity of heat is removed from at least one further cooling box. This state of the heat flow direction can, in relation to the individual cooling box, be static or reversible or dynamically changing. The heating- or cooling-medium circuit can be closed or open or provided with pressure equalisation.

In one embodiment, the cooling box has at least two separate self-contained hollow spaces. The hollow spaces can be closed or each provided with at least one entrance. Identical or different heating or cooling media can be in identical or different states in the hollow spaces.

In one embodiment, at least two hollow spaces are connected to one another in series or in parallel, or combinations thereof, inside the cooling box or outside via the heating- or cooling-medium entrances or combinations thereof.

In one embodiment, the heating or cooling medium flows through the cooling box via convection or is circulated by a pump or by combination of same.

In one embodiment, the cooling box is provided with standardised or non-standardised optical or optoelectrical connectors or components. Connectors or components can be, for example, ferrules or optoelectrical transducers or light-guide connections.

In one embodiment, an RFID unit is connected to the cooling box.

In one embodiment, at least one conductor track of the RFID unit and/or at least one antenna of the RFID unit and/or at least one active and/or passive component part of the RFID unit is connected to the cooling box.

In one exemplary embodiment, the cooling box consists of technical aluminium oxide with a minimum aluminium oxide content of 89%. The metallisation regions are suitable for being able to solder on component parts, for example, and therefore produce an intimate connection. The connection to a commercially available LED, for example, can be produced via a soldered connection. The soldered connection has at least the functions of the mechanical connection between the LED and the cooling box. In addition, the metallisation regions makes it possible to make electrical contact with the LED and to make thermal contact.

Using the example of a construction of a cooling box with printed-on and sintered metallisation regions (also conductor track cross-sections) with a soldered-on point heat source, for example an LED, the technically necessary electrical conductor track cross-section can be chosen to be significantly larger than is necessary, since at the same time as the electrical conduction via the metallisation regions and conductor track cross-sections, the heat is also spread over a larger surface area of the cooling box. Compared with an electrically expedient and sufficient smaller metallisation region and conductor track cross-section, a greater quantity of heat can be distributed over the surface of the cooling box in a shorter period of time via enlarged metallisation regions and conductor track cross-sections.

The cooling box, also referred to below as body, can preferably consist of at least one ceramic component or a composite of different ceramics. Examples which may be mentioned are technical aluminium oxide 80-99.9%, aluminium oxide, beryllium oxide, zirconium oxide, stabilised zirconium oxide, aluminium nitride, zirconium-strengthened aluminium oxide, glass ceramic or ceramics produced by mixtures of at least two different ceramics or additives. Monocrystalline ceramics may be, for example, sapphire.

The body may also consist of a composite material. Matrix materials, for example resins, polymers or silicones with additives, may be used. The additives bring about a change in the thermal conductivity of the matrix materials. Multicomponent systems may preferably be polymers with $Al_2O_3$, polymers with AlN, silicones with $Al_2O_3$/AlN.

The body may be rigid or flexible or a combination of rigid/flexible.

The body may be a metal/ceramic composite or a composite of body and metal.

The body may be of multilayered construction with inner conductor tracks and electrical component parts, such as resistors, coils, capacitors, etc., electrically conductive regions between the layers also being possible.

The body may also be used as a replacement for an electrically conductive cooling body, in this case in particular if the environment has a corrosive effect.

The body may, at the same time, also be a mounting housing.

The use of the cooling box according to the invention has the following advantages:

Reduction of the variety of components
Expansion of the variety of functions
Intrinsic protection against thermal overload
Long-term reliability
Avoidance of TCE mismatch owing to the use of greatly differing materials
Increase in power owing to improved heat dissipation
Difficulty of directly dissipating high heat losses has been overcome
Basic principle can be transferred to manifold applications
An "automatic" system-inherent thermal balance
Indirect mounting of the heat source in a separate housing, which in turn can be mounted on the body, is eliminated Heat sources may be electrical or electronic component parts, such as heating elements, Peltier elements, resistors, active and passive semiconductors, for example.

The heat can be produced intentionally as a function or can arise as a by-product when performing the function.

The heat sources can also experience changes in their functionality owing to the heat produced by them during operation.

The heat sources can be directly connected to the body, for example by a soldered connection.

IGBTs

Modules are subject to ever greater powers per area and the permanent functionality of these modules can only be ensured by mounting cooling bodies.

In this case, the cooling box according to the invention is chosen for the thermal dissipation.

LEDs (Light-Emitting Diodes) or Laser Diodes

With the prior art, it has hitherto not been possible, or only possible to a limited extent, to satisfy greater demands in terms of luminance. The reasons for this are the poor thermal management associated with the prior art. As the luminance increases, the waste heat increases. The waste heat significantly influences the service life and the colour constancy. The same also applies to applications with laser diodes.

According to the invention, the semiconductors can be mounted directly on a printed circuit board or first housed and then placed onto the printed circuit board as a component part. The circuit arranged on the printed circuit board in turn is cooled, according to the invention, by the cooling box or the semiconductor is provided directly with an additional cooling box. Semiconductors may also be, for example, solar cells, since their power output decreases with increasing temperature. In this case, the semiconductor itself would not produce any waste heat which would need to be dissipated, but here the semiconductor is heated by the IR component of the sunlight.

Controllers

The prior art, for example in motor cars, involves separating the heat sources from the circuit and electrically connecting them. In this case, too, the construction with thermally conductive cooling bodies is used.

Corrosion of Cooling Bodies

Under certain application conditions, surface corrosion occurs in the case of electrically conductive cooling bodies. The surface compounds produced by chemical conversion change the transfer to the cooling medium and may also change the surface, for example due to pitting. Cooling boxes made of a ceramic eliminate this problem.

Ceramic Heating Element

Use for thermal stabilisation of the cooling body itself or the direct or indirect environment.

Peltier Application

Peltier elements have a cold and a warm side. Depending on the application, the construction can always be seen in combination with a separate cooling body. Here, the Peltier element can be applied directly to the electrically insulating cooling body. The opposite effect may also be utilised to generate electric voltage from a temperature difference (Seebeck effect).

Sensor system internally/on the surface owing to direct feedback in the dedicated system The cooling body itself can contain a sensor system which has been introduced or mounted/applied on/to a surface. Owing to the direct coupling to the system, self-regulating protective functions of the heat sources are possible.

Mounting of the Cooling Body

Mounting Points, Pads, Cavities, Mounting Pins

Active and Passive Cooling bores fans ribs in cooling medium other than air

When mounting the component part and cooling body, the prior art often also requires a third component, a so-called heat-conducting film, which at the same time must also be electrically insulating. In order that the desired effect of the heat dissipation can be achieved, the cooling body and the component part must have flat and plane-parallel surfaces, in order that a 100% interlocking connection is ensured. If a heat-conducting film is used as well, this too must have a flat and plane-parallel surface. When mounting such a construction, a screw connection is often chosen. If distortions occur in the construction during the mounting or operation, the thermal contact may be partially lost. Consequently, the functionality and service life of the construction are jeopardised.

According to the invention, there is now for the first time the possibility of a soldered connection on the electrically insulating cooling bodies, the above-described disadvantages of the thermal coupling not arising during the soldering operation.

Multilayered Sandwich Construction

Simple mechanical connections of the cooling body for mounting the unit itself and for connection to further cooling bodies and/or functions associated with bodies.

Self-Cooled Printed Circuit Board

The prior art is to provide a printed circuit board having inadequate thermal management with an electrically conductive cooling body. In this case, the thermal coupling is set limits insofar it must be stable for a long period of time. Limiting factors are, for example, the temporal and geometrical change of the electrically insulating medium.

The invention is explained below with reference to figures.

FIG. 1 shows a cooling box 1 which consists of two sub-pieces 1'. The two sub-pieces 1' are identical in the configuration shown here and enclose a hollow space which is arranged between the two sub-pieces 1'. The hollow space is not visible in this figure. This hollow space is connected to the outside environment via two openings 2. A cooling medium can be led into the hollow space via the two openings.

Figure 2:
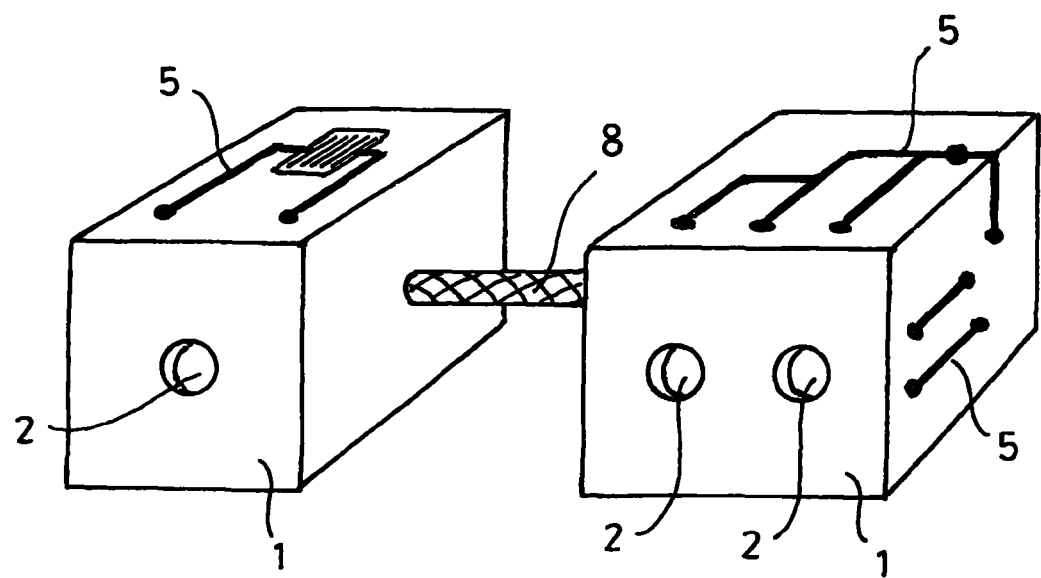

FIG. 2 shows two cooling boxes 1 according to the invention, which both enclose a respective hollow space, not visible in the figure. Both cooling boxes 1 are formed in one piece and are connected to one another via a mounting possibility 8, in this case a pin soldered onto the cooling boxes 1. The hollow spaces are connected to the outside environment via openings 2. One cooling box has only a single opening 2. The cooling medium can in this case pass into the hollow space by convection. The other cooling box shown has two openings 2. Here, the cooling medium can be, for example, pumped into the hollow space. The two cooling boxes consist of a ceramic and are electrically non-conductive or virtually non-conductive. According to the invention, in the case of both cooling boxes, at least one surface region of the cooling box 1 is defined by the functions of electrical and/or thermal conductivity. The surface region of the cooling boxes 1 which is defined by the functions of electrical and/or thermal conductivity is a metallisation layer sintered to the material of the cooling boxes 1. In the embodiment shown here, this surface region is a printed circuit board 5. These surface regions can be arranged on all sides and also in the hollow space of the cooling boxes 1.

Figure 3:
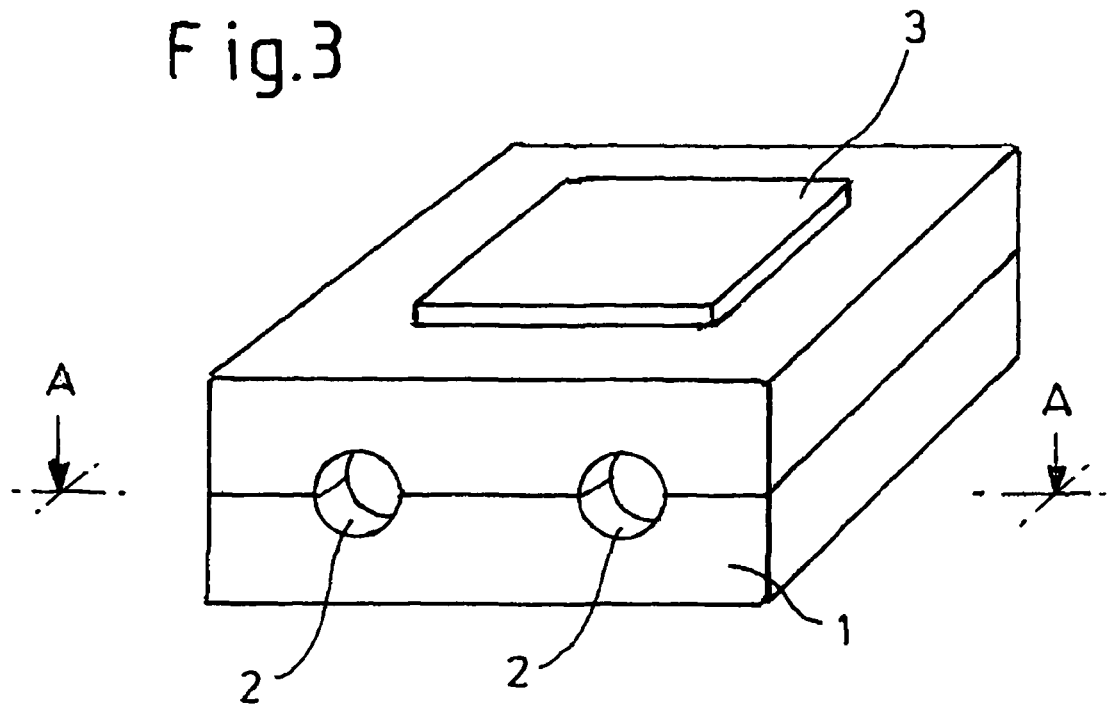
Figure 4:
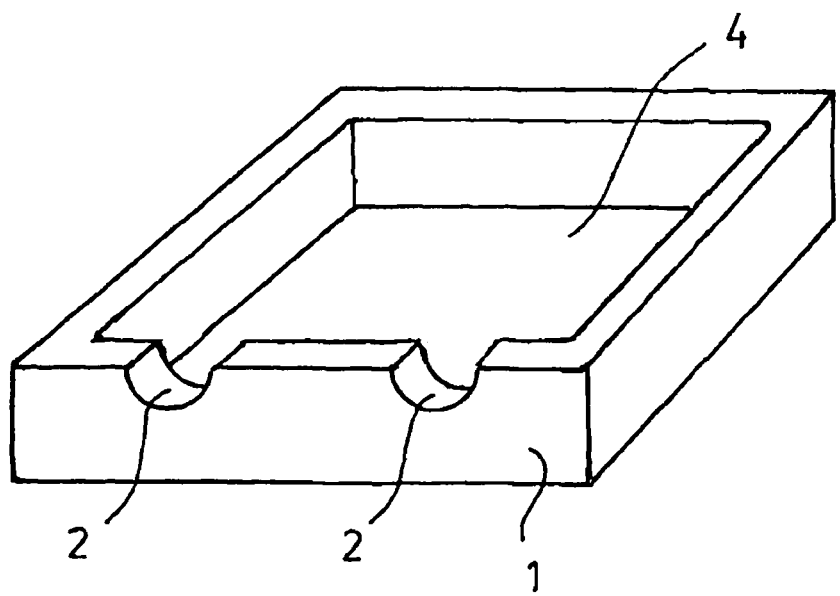

FIG. 3 shows a cooling box 1, similar to FIG. 1, which consists of two sub-pieces. FIG. 4 shows a section along the line A-A of FIG. 3. The two sub-pieces are of identical form and enclose a hollow space 4 which is arranged between the two sub-pieces. This hollow space 4 is connected to the outside environment via two openings 2. A cooling medium can be led into the hollow space 4 via the two openings. According to the invention, to the top side of the cooling box 1 there is applied a metallisation layer 3 which is sintered to the material of the cooling box 1.

Figure 5:
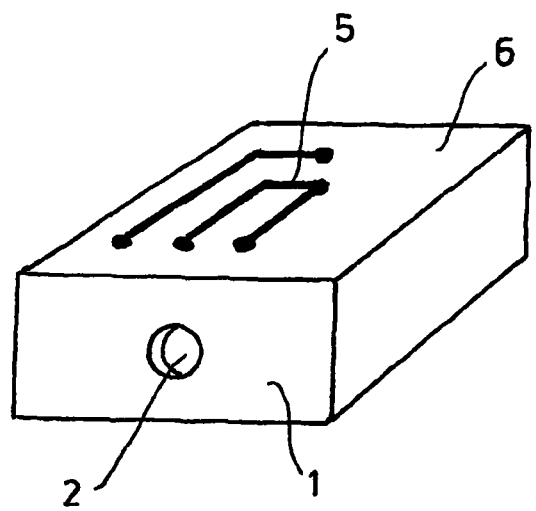

FIG. 5 shows, like the left cooling box from FIG. 2, a one-part cooling box 1 with an opening 2 for a hollow space, not shown here. A metallisation layer 5 formed as a printed circuit board is applied to the top surface 6 of the cooling box 1. In this case too, the cooling box 1 consists of a ceramic as the material of the cooling box. The metallisation layer 5 is sintered to the material of the cooling box 1 in this case too.

Figure 6:
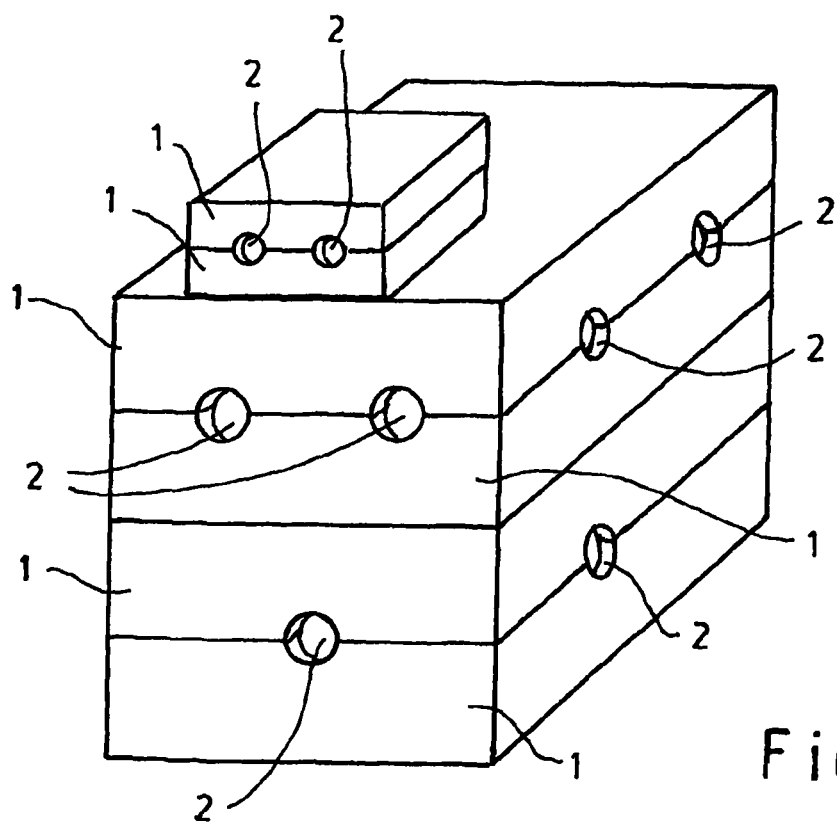

FIG. 6 shows a total of three cooling boxes 1 which are connected to one another to form a type of three-dimensional array. Each of the cooling boxes 1 has openings 2 for supplying the cooling medium. What is not shown is that the surface regions of the cooling boxes 1 are defined by the functions of electrical and/or thermal conductivity, i.e. have metallisation layers sintered to the material of the cooling boxes 1.

Figure 7:
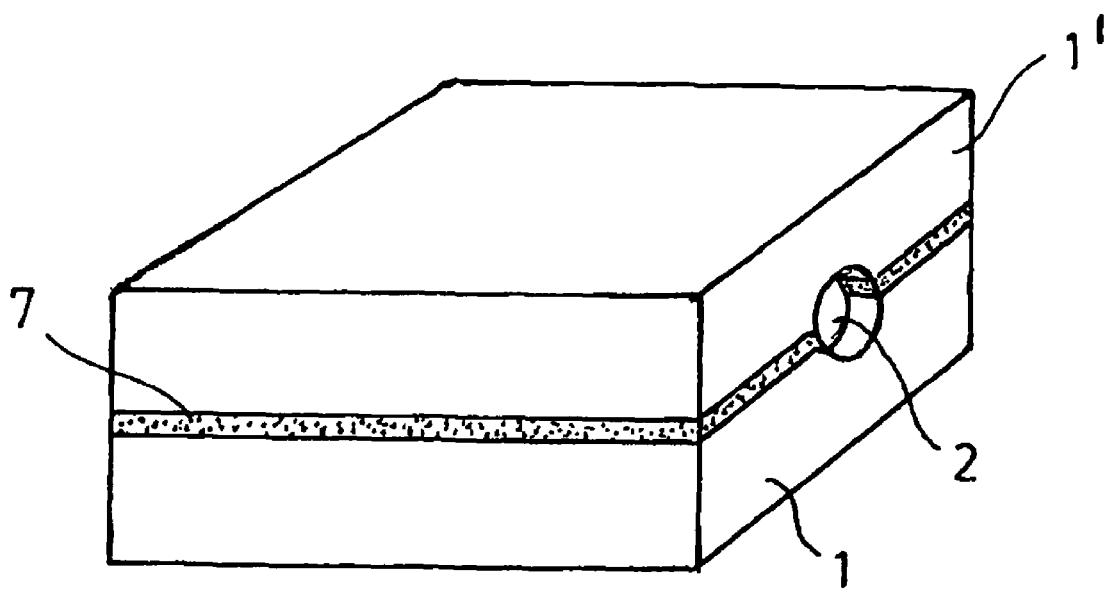

FIG. 7 shows a cooling box 1 which consists of two identical sub-pieces 1'. These sub-pieces 1' are connected to one another by a connecting material 7, in this case an adhesive. Here too, the sintered metallisation layers are not shown.

The invention claimed is:

1. A cooling box for electrical component elements comprising a material enveloping a hollow space, wherein the cooling box has at least one electrically conductive surface region but the remainder is electrically non-conductive and is constructed in one piece, and wherein the hollow space is provided with an opening, wherein the surface region is electrically conductive, wherein the surface region is a metallization layer sintered to the material of the cooling box.

2. A cooling box according to claim 1, wherein the surface region is a printed circuit board.

* * * * *